United States Patent [19]

Nelson et al.

[11] Patent Number: 5,717,403
[45] Date of Patent: Feb. 10, 1998

[54] METHOD AND APPARTUS FOR ACCURATE FREQUENCY SYNTHESIS USING GLOBAL POSITIONING SYSTEM TIMING INFORMATION

[75] Inventors: Frederick Nelson, Moline, Ill.; Richard Kai-Tuen Woo, Orange; Ronald R. Hatch, Wilimington, both of Calif.

[73] Assignee: Litton Consulting Group, Inc.

[21] Appl. No.: 524,083

[22] Filed: Sep. 6, 1995

[51] Int. Cl.$^6$ .................................................. G01S 5/02
[52] U.S. Cl. ........................ 342/357; 342/352; 325/200
[58] Field of Search .................................. 342/352, 357; 455/12.1; 364/449; 375/250

[56] References Cited

U.S. PATENT DOCUMENTS

| | | | |
|---|---|---|---|
| 4,112,372 | 9/1978 | Holmes et al. | 325/321 |
| 4,928,106 | 5/1990 | Ashjaee et al. | 342/352 |
| 5,003,553 | 3/1991 | Schluge et al. | 375/1 |
| 5,043,736 | 8/1991 | Darnell et al. | 342/357 |
| 5,153,599 | 10/1992 | Hirigae et al. | 342/342 |
| 5,222,099 | 6/1993 | Hori et al. | 375/1 |
| 5,420,592 | 5/1995 | Johnson | 342/357 |
| 5,440,313 | 8/1995 | Osterdock et al. | 342/352 |

FOREIGN PATENT DOCUMENTS

| | | |
|---|---|---|
| 0 564 220 A2 | 6/1993 | European Pat. Off. |
| 96 30 6190 | 11/1996 | European Pat. Off. |
| WO94/28433 | 12/1994 | WIPO. |

*Primary Examiner*—Thomas H. Tarcza
*Assistant Examiner*—Dao L. Pham
*Attorney, Agent, or Firm*—Gary S. Williams; Flehr Hohbach Test Albritton & Herbert LLP

[57] ABSTRACT

A method and apparatus for synthesizing a stable reference signal of a desired frequency within a spread spectrum receiver is disclosed herein. The spread spectrum receiver is designed for use in conjunction with a global positioning system (GPS) receiver, and operates to receive broadcast differential GPS correction information. The present frequency synthesis technique contemplates generating a sequence of timing signals within the GPS receiver on the basis of GPS satellite signals received thereby, and providing the timing signals to the signal receiver. Within the signal receiver, the signal cycles of a local oscillator occurring between ones of the timing signals are counted. The frequency of the local oscillator is then determined by dividing the counted cycles of the local oscillator by one of the known time intervals. The determined frequency of output signals produced by the local oscillator is then scaled so as necessary to produce the reference signal of desired frequency. This allows precisely controlled reference frequencies to be obtained irrespective of the existence of frequency instability within the local oscillator. In a preferred implementation, the stable reference signals are employed during acquisition of differential GPS correction signals received by the spread spectrum receiver. In particular, the desired reference frequency is incrementally adjusted during the process of searching for and acquiring the exact frequency of the incident differential GPS correction signals. The spread spectrum receiver is disposed to provide differential GPS correction information extracted from the acquired differential GPS correction signals to the GPS receiver.

8 Claims, 2 Drawing Sheets

# METHOD AND APPARTUS FOR ACCURATE FREQUENCY SYNTHESIS USING GLOBAL POSITIONING SYSTEM TIMING INFORMATION

The present invention relates generally to timing and frequency control of communication receivers. More particularly, the present invention is directed to a technique for generating accurate reference frequencies within spread spectrum communication receivers using timing information available from the Global Positioning System ("GPS").

BACKGROUND OF THE INVENTION

The global positioning system (GPS) may be used for determining the position of a user on or near the earth, from signals received from multiple orbiting satellites. The orbits of the GPS satellites are arranged in multiple planes, in order that signals can be received from at least four GPS satellites at any selected point on or near the earth.

The orbits of the GPS satellites are determined with accuracy from fixed ground stations and are relayed back to the spacecraft. In navigation applications of GPS, the latitude, longitude, and altitude of any point close to the earth can be calculated from the times of propagation of the electromagnetic signals from four or more of the spacecraft to the unknown location. A measured range, or "pseudorange", between the GPS receiver at the unknown location and the four satellites within view is determined based on these propagation times. The measured range is referred to as pseudorange because there is generally a time difference or offset between timing clocks on the satellites and a timing clock within the GPS receiver. Thus, for three-dimensional position determination at least four satellite signals are needed to solve for four unknowns, i.e., the time-offset together with the three-dimensional position.

The nature of the signals transmitted from GPS satellites is well known from the literature, but will be described briefly by way of background. Each satellite transmits two spread-spectrum signals in the L band, known as L1 and L2, with separate carrier frequencies. Two signals are needed if it is desired to eliminate an error that arises due to the refraction of the transmitted signals by the ionosphere. Each of the carrier signals is modulated in the satellite by at least one of two pseudorandom codes unique to the satellite. This allows the L-band signals from a number of satellites to be individually identified and separated in a receiver. Each carrier is also modulated by a slower-varying data signal defining the satellite orbits and other system information.

The L-band GPS satellite signals also carry information relating to standardized GPS time, as well as to UTC time. Within each GPS receiver, this timing information is used to calibrate a local GPS receiver clock. Such calibration facilitates rapid signal acquisition, and enhances accuracy of position estimates produced by the GPS receiver.

Recently, GPS receivers have been introduced which provide a 1 pulse per second (pps) timing output synchronized to either GPS or UTC time. This pulsed timing output from GPS receivers has been utilized in, for example, the telecommunications industry as a means of coordinating timing throughout communications networks. The sequence of timing pulses is typically generated within the GPS receiver on the basis of the pseudorange data acquired from the signals received from a number of GPS satellites. Specifically, after compensating for propagation delay and broadcast satellite clock corrections to produce local time estimates for each satellite, the GPS receiver averages a number of the local satellite time estimates as a means of accurately approximating standardized GPS time. Each pulse of the 1 pps timing output is then made to coincide with a transition between each second of the estimated GPS standard time.

In at least one existing system, the differential GPS correction data specifying the satellite clock offsets and other correction data is collected by a plurality of widely distributed terrestrial GPS reference stations. This correction data is provided to a central satellite communication facility, where it is transmitted on an uplink channel to orbiting communication satellites. Next, the correction data is broadcast from the orbiting communication satellites to terrestrial users in the form of a C-band spread spectrum signal. Accordingly, C-band spread spectrum receivers are often deployed in association with GPS receivers to enable acquisition of the broadcast differential GPS correction signal.

After the broadcast differential GPS correction signal is acquired by such a C-band receiver, the inherent differential GPS correction data produced by the various terrestrial reference stations is extracted from the received signal. The differential GPS correction data corresponding to each terrestrial reference station is then weighted and combined. The weighting function is typically based on, among other things, the proximity of the C-band receiver to each of various terrestrial GPS reference stations responsible for generating the correction data. The C-band receiver is provided a rough position estimate by its companion GPS receiver, which allows the spread spectrum receiver to determine its proximity to each of the fixed, terrestrial GPS reference stations. After the differential GPS correction data is weighted, the weighted differential GPS correction data is converted within the C-band receiver to a standard format. The formatted differential GPS correction data is then transferred to the GPS receiver to enable calculation of a refined position estimate.

The C-band receiver typically executes a frequency and code searching procedure as part of the process of receiving the broadcast differential GPS correction data. This involves, for example, adjusting the timing of pseudorandom code locally generated within the C-band receiver until it matches that of the incident differential GPS correction signal. In addition, the mixing frequency locally generated within the C-band receiver must be adjusted to account for any Doppler shift inherent within the incident differential GPS correction signal. Signal searching typically proceeds by adjusting the mixing frequency in small steps (frequency bins), with the timing of the locally generated code also being varied within each frequency bin. This search is thus "two-dimensional" in that both signal frequency and code offset are manipulated until the incident correction signal is acquired.

Such a two-dimensional search strategy may require considerable time for signal acquisition to be achieved, particularly if cost is minimized by employing imprecise reference oscillators within the C-band receiver. With respect to the two-dimensional search discussed above, the width of each frequency bin relative to the frequency of the incident differential GPS correction signal is approximately 1 part in $10^7$. Unfortunately, reference oscillators capable of producing reference signals characterized by a stability of 1 part in $10^7$ are typically much more expensive than those which provide reference signals of lower stability. Use of reference oscillators of less stability will generally proportionally increase the time required to search a given number of frequency bins, and will thus tend to proportionally increase the time required for signal acquisition.

Accordingly, it is an object of the invention to provide a technique for generating, using inexpensive reference oscillators, reference signals of high frequency precision for use in acquisition of differential GPS correction signals.

SUMMARY OF THE INVENTION

In summary, the present invention is designed for implementation within a system comprised of a global positioning system (GPS) receiver and an associated spread spectrum signal receiver for receiving differential GPS correction information. The present invention relates to a method and apparatus for synthesizing a stable reference signal of a desired frequency within the spread spectrum signal receiver. In particular, the present invention contemplates generating a sequence of timing signals within the GPS receiver on the basis of GPS satellite signals received thereby, and providing the timing signals to the signal receiver.

Within the signal receiver, the signal cycles of a local oscillator occurring between ones of the timing signals are counted. The frequency of the local oscillator is then determined by dividing the counted cycles of the local oscillator by one of the known time intervals. The output signals produced by the local oscillator are then scaled in frequency as necessary to produce the reference signal of desired frequency, which is used during local generation of the spread spectrum code. In this way a precisely controlled reference frequency may be obtained irrespective of the existence of frequency instability within the local oscillator.

In a preferred implementation, the stable reference signal is employed during acquisition of differential GPS correction signals received by the spread spectrum receiver. In particular, the desired reference frequency is incrementally adjusted during the process of searching for and acquiring the exact frequency of the incident differential GPS correction signals. Once the incident differential GPS correction signals have been acquired, the spread spectrum receiver is disposed to provide differential GPS correction information extracted from the differential GPS correction signals to the GPS receiver.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
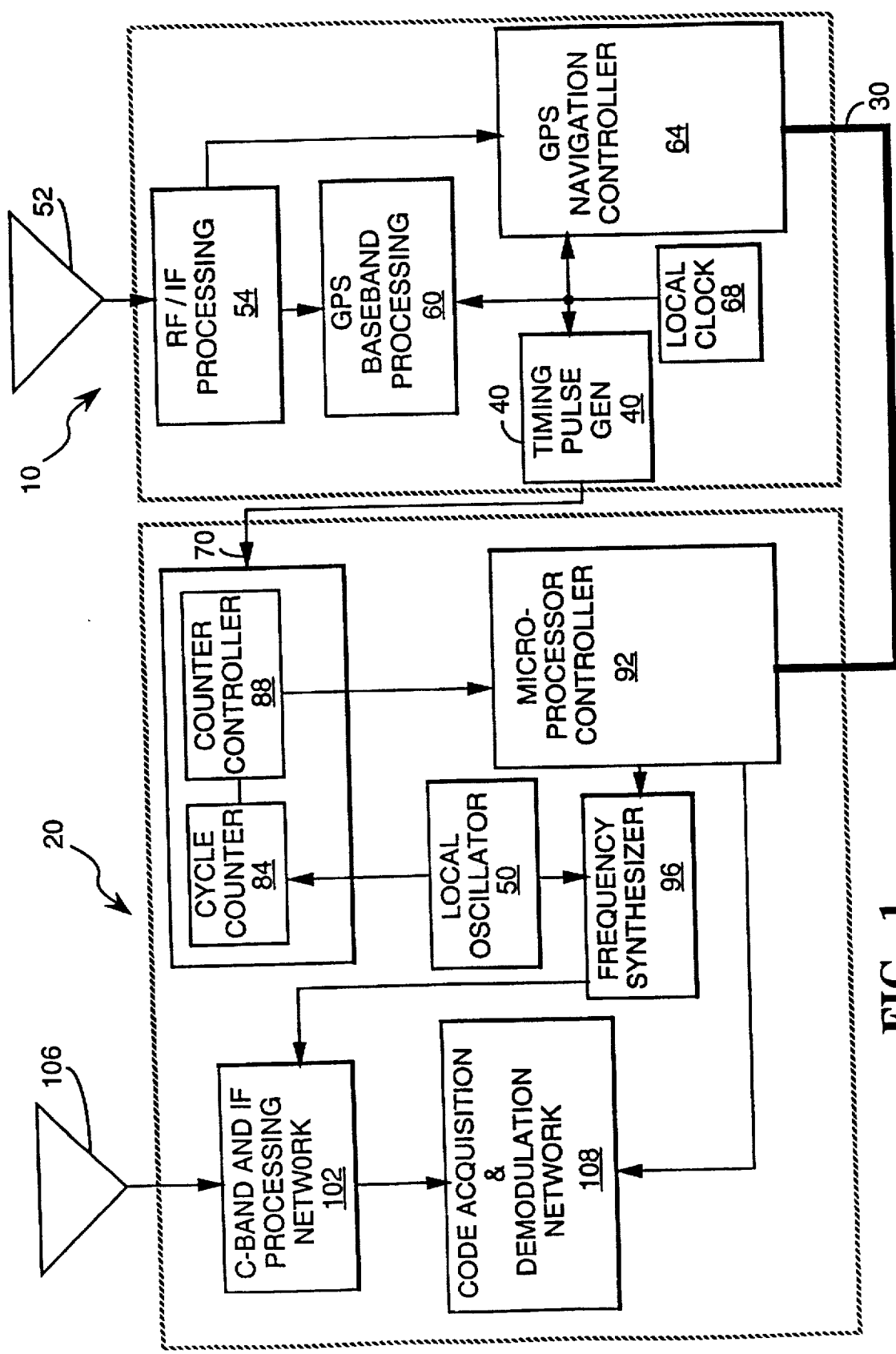
FIG. 1 shows a block diagram representation of a global positioning system (GPS) receiver and a C-band spread spectrum receiver configured in accordance with the present invention.

Referring to FIG. 1, there is shown a block diagram representation of a global positioning system (GPS) receiver 10 and a C-band spread spectrum receiver 20. The GPS receiver 10 and spread spectrum receiver 20 are designed for two-way communication over a standard digital data link 30, such as an RS-232 data link. In the embodiment of FIG. 1, the spread spectrum receiver 20 receives C-band differential GPS correction signals from GPS satellite reference stations (not shown). The receiver 20 extracts differential GPS correction information from these differential GPS correction signals and provides this information to the GPS receiver 10 over the data link 30. As is well known, this correction information allows highly accurate "differential GPS" position estimation to be performed within the GPS receiver 10.

The differential GPS correction information provided by the C-band receiver 20 are also utilized by a timing pulse generator 40 within the GPS receiver 10. Specifically, the pulse generator 40 uses the GPS satellite signals received by the GPS receiver 10, to generate a timing pulse sequence synchronized to GPS or UTC time. For convenience, the timing pulse sequence will be described hereinafter as being synchronized to GPS time, it being understood that synchronization to UTC time is equally within the scope of the present invention.

The sequence of timing pulses will typically be provided to the spread spectrum receiver 20 by the pulse generator 40 via the dedicated timing line 70 at an exemplary rate of 1 pulse per second (pps). The timing pulse sequence is then used to estimate the frequency of a local oscillator 50 once every GPS second. The output of the local oscillator 50 may then be scaled in frequency (i.e., multiplied and or divided) as necessary to provide a reference signal of a desired frequency for use elsewhere within the spread spectrum receiver 20. In a preferred embodiment the reference signal is scaled every second as a means of expediting the search for the instantaneous frequency of the differential GPS correction signals being received by the spread spectrum receiver 20. In this way the present invention obviates the need for the inclusion of an expensive, high-precision local oscillator within the spread spectrum receiver 20 in order to obtain a stable reference frequency. Instead, the present invention contemplates use of the timing pulse sequence furnished by the GPS receiver 10 as a means of enabling a precise reference frequency to be synthesized from an otherwise imprecise local oscillator signal. This allows the local oscillator 50 to be realized inexpensively, without comprising the frequency precision of the reference signal used in acquisition of incident differential GPS correction signals.

A preferred manner in which such a precise reference frequency may be synthesized in accordance with the invention is set forth below. This discussion is preceded, however, by a brief description of those aspects of the GPS receiver 10 pertinent to the present invention.

Turning again to FIG. 1, the L-band frequency signals simultaneously received by an antenna 52 from a plurality of GPS satellites are supplied to an RF/IF processing network 54. Within the processing network 54 the received GPS satellite signals are frequency downconverted to a plurality of intermediate frequency (IF) signals. The IF signals from downconverter 54 are digitized into phase quadrature digital representations of each received L1 band satellite signal, and are provided to a GPS baseband processing network 60.

The GPS baseband processing network 60 will typically include a plurality of baseband processing circuits (not shown), each of which is associated with a separate satellite from which a signal is received. Each of the baseband processing circuits is capable of recognizing the digitized outputs from the IF processing network 60 corresponding to a particular satellite. This recognition is effected by decorrelating the digitized IF outputs using locally generated replicas of the C/A and P codes unique to each satellite. As is indicated by FIG. 1, information derived from the digital IF signals during processing within the GPS baseband processing network 60 is provided to a GPS navigation controller 64. In particular, satellite code and phase measurements, as well as GPS timing information, are passed from the baseband GPS processing network 60 to the GPS navigation controller 64.

In addition to making position/velocity determinations, the GPS navigation controller 64 functions to calibrate a local clock 68 within the GPS receiver 10. The local clock 68 serves as the time base for the baseband processing network 64, as well as for the timing pulse generator 40. The timing pulse sequence produced by the timing pulse generator 40 is passed to the spread spectrum receiver 20 over a dedicated timing line 70.

Within the spread spectrum receiver 20, the timing pulse sequence from the timing line 70 is provided to a cycle counter 80, which is coupled to the output of the local oscillator 50. In accordance with the invention, the cycle counter 80 is designed to count the number of sinusoidal cycles of the local oscillator 50 occurring between each pair of pulses within the timing pulse sequence. Since in the preferred embodiment each pair of timing pulses is separated by exactly one GPS second, the number of counted cycles is equivalent to the average frequency over the counting interval of the local oscillator 50.

The cycle counter circuit 80 includes a counter circuit 84 connected to the output of the local oscillator 50, and a counter control circuit 88 for controlling the counter circuit 84 based on the timing pulse sequence. Upon receipt of each timing pulse, the counter control circuit 88 stops the counter circuit 84 and latches the number of cycles of the local oscillator 50 which have occurred subsequent to the previous timing pulse. The counter control circuit 88 then reports this counted number of cycles (i.e., the measured frequency of the local oscillator) to a microprocessor controller 92, and resets the counter circuit 84. After being reset, the counter circuit 84 again begins counting the cycles of local oscillator 50.

The output of the local oscillator 50 is also provided to a frequency synthesizer 96. Since the microprocessor controller 92 is aware of the instantaneous measured frequency of the local oscillator 50, the frequency synthesizer 96 may be instructed to scale the local oscillator frequency so as to produce a reference signal of desired frequency. These reference signals are used by a C-band/IF processing network 102 to search for the exact frequency of the incident differential GPS correction signals.

Referring to FIG. 1, the differential GPS correction signals incident upon antenna 106 of the C-band receiver 20 are provided to the C-band/IF processing network 102. The processing network 102 functions to acquire the frequency of the received differential GPS correction signals in a conventional manner by sequentially searching a set of frequency "bins" centered about a nominal C-band center frequency. This search is controlled by the microprocessor 92, which commands the frequency synthesizer 96 to provide the required reference signal frequencies to the processing network 102. In the preferred embodiment this frequency search proceeds in parallel with a code search, which is effected by a code acquisition and demodulation network 108 under the control of the microprocessor 92. As part of this control process, microprocessor 92 provides the network 108 with a code rate offset associated with the particular frequency bin being searched.

The incident C-band correction signal includes correction information compiled by a plurality (e.g., ten) of terrestrial GPS reference stations. Within the receiver 20, the code acquisition and demodulation network 108 operates in a conventional manner to correlate the received C-band correction signals with the locally-generated PRN code (also called the locally generated code replica). By appropriately adjusting the phase of the locally-generated PRN code, the correction data compiled by the GPS reference stations is extracted by the demodulation network 108 from the received C-band correction signal. However, in the present invention the conventional phase code adjustment is modified in accordance with changes in the measured frequency of the local oscillator to ensure that the code acquisition scanning proceeds at the correct rate. In other words, the code acquisition process automatically adjusts for fluctuations in the frequency of the local clock by adjusting the phase of the locally generated code in accordance with changes in the measured local clock frequency.

After code acquisition, the demodulation network 108 automatically tracks any further fluctuations in the frequency of the reference signal generated by the frequency synthesizer 96, which in turn is affected by fluctuations in the frequency of the local oscillator 50. Nevertheless, even after code acquisition, the microprocessor 92 continues to adjust the control signals it sends to the frequency synthesizer 96 so as to keep the frequency of the reference signal generated by the frequency synthesizer 96 as close as possible to its selected target value.

The correction data from each GPS reference station is provided by the network 108 to the microprocessor 92, which also receives from the GPS receiver 10 an estimate of the position of the co-located GPS and spread spectrum receivers 10 and 20. The correction data from each GPS reference station is then weighted on the basis of various factors, one of which typically corresponds to the proximity of a given reference station to the estimated position of the GPS and spread spectrum receivers 10 and 20. After the differential GPS reference station correction data is weighted and combined, the resultant differential GPS correction factor is provided by the microprocessor 92 to the GPS receiver 10 over the data link 30. The differential GPS correction factor is then used to adjust the pseudorange measurements performed within the GPS receiver 10 in accordance with conventional differential GPS techniques.

Figure 2:
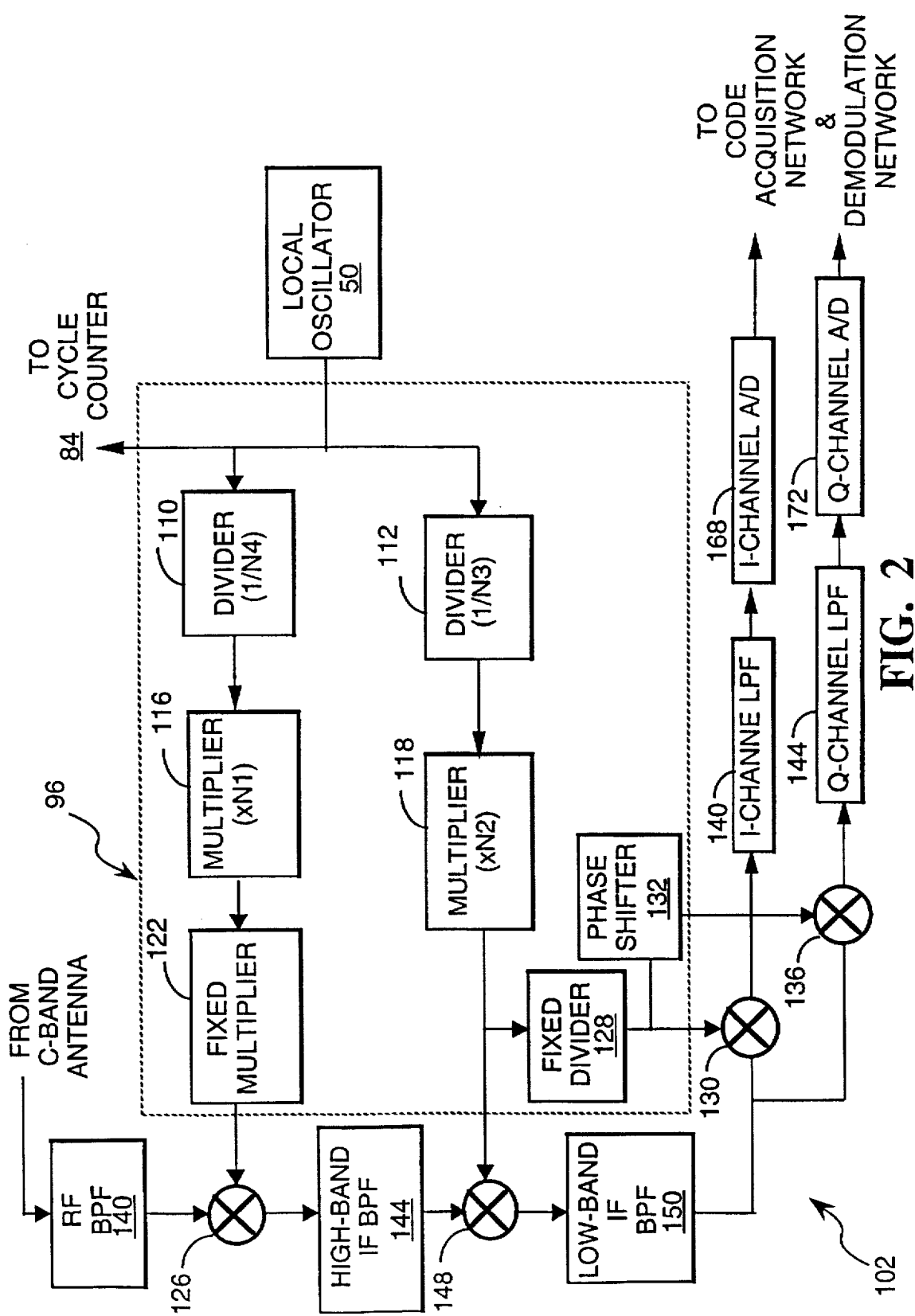
FIG. 2 is a generalized schematic representation of a frequency synthesizer and signal processing network included within the C-band spread spectrum receiver.

Turning now to FIG. 2, a generalized schematic representation is provided of the frequency synthesizer 96 and C-band/IF processing network 102. The frequency synthesizer 96 is seen to include a pair of frequency dividers 110 and 112 coupled to the output of the local oscillator 50. The frequency dividers 110 and 112 are programmed by the microprocessor 92 (FIG. 1) to scale the local oscillator frequency by the factors 1/N4 and 1/N3, respectively. The frequency synthesizer 96 further includes a pair of frequency multipliers 116 and 118 coupled to the outputs of the frequency dividers 110 and 112, respectively. The multipliers 116 and 118 are programmed to effect frequency multiplication by the factors N1 and N2, respectively.

In the exemplary embodiment of FIG. 2, the frequency synthesizer 96 further includes a fixed-value frequency multiplier 122 interposed between the multiplier 116 and an RF mixer 126 within the C-band/IF processing network 102. In addition, a fixed-value frequency divider 128 is connected between the output of the multiplier 118 and an I-channel IF mixer 130 within the C-band/IF processing network 102. Finally, a 90° phase shifter 132 is coupled between the fixed divider 128 and a Q-channel IF mixer 136.

Referring to FIG. 2, the C-band correction signals received by the C-band antenna 106 (FIG. 1) are filtered by an RF bandpass filter (BPF) 140. In the exemplary embodiment of FIG. 2 the RF BPF is centered about 3847.5 MHz, and has a passband extending from 3760 to 4160 MHz. The filtered RF signal from the RF BPF 140 is mixed down to an exemplary IF frequency of 902.5 MHz within the RF mixer 126 using a 2945 MHz reference frequency from the frequency synthesizer 96. The 2945 MHz reference frequency is obtained by programming the divider 110 to scale the 20 Mhz local oscillator frequency by the factor 1/24 (i.e., 1/N4=1/24), and by programming the multiplier 116 to multiply by a factor of 1178 (i.e., N1=1178). In the exemplary embodiment the fixed multiplier 22 is configured to effect frequency multiplication by a factor of 3.

The 902.5 MHz IF signal from the mixer 126 is then filtered by a high-band IF filter 144. In the exemplary embodiment the high-band IF BPF 144 comprises a pair of series-connected 2-pole bandpass filters, each being centered at 902.5 MHz and each having a 3-dB cutoff frequency of 20 MHz.

The C-band/IF processing network 102 further includes an IF mixer 148 operative to further downconvert the 902.5 MHz output of the IF filter 144 to an exemplary low-band IF frequency of 53.088 MHz. This is achieved by providing the IF mixer 148 with a 849.412 MHz reference frequency, which is also generated within the frequency synthesizer 102 using the 20 MHz output of the local oscillator 50. Specifically, the 849.412 reference signal is generated by programming: (i) the divider 112 to scale the local oscillator frequency by a factor of 1/17 (i.e., 1/N3=1/17), and (ii) the multiplier 118 to perform frequency multiplication by the factor 722 (i.e., N2=722).

The 53.088 MHz IF signal from the mixer 148 is then filtered by a low-band IF filter 150. In the exemplary embodiment the low-band IF BPF 150 comprises a pair of series-connected 2-pole bandpass filters, each being centered at 53.088 MHz and each having a 3-dB cutoff frequency of 13.5 MHz.

Referring to FIG. 2, the I-channel and Q-channel mixers 130 and 136 each receive the 53.088 MHz output from the low-band IF filter 150. In addition, the I-channel mixer 130 receives a 53.088 MHz reference signal from the fixed-value divider 132, and the Q-channel mixer receives a phase-quadrature version of the 53.088 reference signal. The resultant I-channel and Q-channel baseband outputs from the mixers 130 and 136 are then filtered by I-channel and Q-channel low-pass filters (LPFs) 140 and 144, respectively. In the exemplary embodiment the I-channel and Q-channel LPFs 140 and 144 are each realized as a 2-pole LPF having a 3-dB cutoff frequency of 20 MHz. The filtered baseband I-channel and Q-channel signals from the LPFs 140 and 144 are then digitized by an I-channel analog to digital converter (A/D) 168, and by a Q-channel A/D 172, respectively, prior to being forwarded to the code acquisition & demodulation network 108.

The code acquisition & demodulation network 108 operates in a conventional manner (except that the code acquisition search process is modified in accordance with the measured frequency) to extract the correction data associated with a plurality of terrestrial GPS reference stations from the digitized I-channel and Q-channel baseband signals provided thereto by the C-band/IF processing network 102. After the differential GPS correction data is weighted and combined within the microprocessor 92, the resultant differential GPS correction factor is converted into a standard format (e.g., RTCM SC-104) for transmission over the data link to the GPS receiver 10.

Various modifications to the embodiments disclosed herein may occur to those skilled in the art without departing from the true spirit and scope of the invention as defined by the appended claims.

What is claimed is:

1. In a system including a global positioning system (GPS) receiver and a signal receiver coupled thereto, a method of synthesizing a reference signal of a desired frequency within the signal receiver, comprising the steps of:

generating timing signals within the GPS receiver on the basis of GPS satellite signals received thereby, and providing the timing signals to the signal receiver in an open loop arrangement, wherein the timing signals are separated by known time intervals; and in the signal receiver, counting cycles of the local oscillator occurring between ones of the timing signals to produce a count value indicative of the local oscillator's frequency, and synthesizing a reference signal for use by the signal receiver, the synthesizing step including calibrating a frequency synthesizer driven by the local oscillator in accordance with the count value so as to synthesize the reference signal at a desired frequency.

2. The method of claim 1, wherein the timing signals are generated at the rate of one per second.

3. The method of claim 1, further including the steps of:

while using the reference signal to tune the signal receiver, receiving at the signal receiver differential GPS correction signals; and communicating correction information to the GPS receiver corresponding to the received differential GPS correction signals.

4. The method of claim 1, wherein the signal receiver is a C-band receiver configured to receive differential GPS correction signals from one or more GPS reference stations;

the method further including communicating correction information to the GPS receiver corresponding to the received differential GPS correction signals.

5. A navigation system, comprising:

a global positioning system (GPS) receiver, the GPS receiver including signal processing circuitry that generates timing signals on the basis of GPS satellite signals received thereby;

a signal receiver having a local oscillator;

an open loop link coupling the GPS receiver to the signal receiver;

a cycle counter in the signal receiver for counting oscillations of the local oscillator, the cycle counter including a port for receiving the timing signals from the GPS receiver via the open loop link, the cycle counter counting cycles of the local oscillator occurring between ones of the timing signals to produce a count value indicative of the local oscillator's frequency; and a frequency synthesizer, in the signal receiver and driven by the local oscillator, that is calibrated in accordance with the count value so as to synthesize a reference signal at a desired frequency.

6. The navigation system of claim 5, wherein the signal processing circuitry in the GPS receiver generates the timing signals at the rate of one per second.

7. The navigation system of claim 5, including:

a signal receiving network in the signal receiver that is tuned in accordance with the reference signal and that extracts differential GPS correction signals from signals received by the signal receiving network; and a data link for communicating correction information to the GPS receiver corresponding to the extracted differential GPS correction signals.

8. The navigation system of claim 5, wherein the signal receiver is a C-band receiver configured to receive differential GPS correction signals from one or more GPS reference stations.

* * * * *